(12) United States Patent
Yang

(10) Patent No.: US 9,147,692 B2
(45) Date of Patent: Sep. 29, 2015

(54) METHOD FOR FORMING SEPARATE NARROW LINES, METHOD FOR FABRICATING MEMORY STRUCTURE, AND PRODUCT THEREOF

(71) Applicant: MACRONIX International Co., Ltd., Hsinchu (TW)

(72) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 90 days.

(21) Appl. No.: 14/143,767

(22) Filed: Dec. 30, 2013

(65) Prior Publication Data

US 2015/0187786 A1    Jul. 2, 2015

(51) Int. Cl.
*H01L 21/4763*    (2006.01)
*H01L 27/115*    (2006.01)
*H01L 21/768*    (2006.01)
*G11C 5/06*    (2006.01)
*H01L 27/02*    (2006.01)

(52) U.S. Cl.
CPC .......... *H01L 27/11565* (2013.01); *G11C 5/063* (2013.01); *H01L 21/76895* (2013.01); *H01L 27/0207* (2013.01); *H01L 27/11568* (2013.01)

(58) Field of Classification Search
CPC .................. H01L 27/11565; H01L 27/11568; H01L 27/76895; H01L 27/0207; H01L 21/76843; H01L 21/76879; H01L 21/76883
USPC ......... 438/629, 637, 639, 640, 667, 700, 701, 438/713; 257/773–774
See application file for complete search history.

(56) References Cited

U.S. PATENT DOCUMENTS

2008/0020582 A1*    1/2008 Bai ............................... 438/714

* cited by examiner

*Primary Examiner* — Hoa B Trinh
(74) *Attorney, Agent, or Firm* — J.C. Patents

(57) ABSTRACT

A method for forming separate narrow lines is described. A target layer is formed over a substrate. Base patterns are formed over the target layer. Target line patterns and connection patterns between the ends of the target line patterns are formed as spacers on the sidewalls of the base patterns. The base patterns are removed. The target line patterns and the connection patterns are transferred to the target layer to form target lines and connection segments between the ends of the target lines. At least a portion of each connection segment is removed to disconnect the target lines while other area of the substrate is subjected to a patterned removal treatment.

16 Claims, 8 Drawing Sheets

X1-X1':

X1-X1':

(a) Top view:

(b) X1-X1':

(c) Y1-Y1':

(a) X3-X3':

(b) Y2-Y2':

METHOD FOR FORMING SEPARATE NARROW LINES, METHOD FOR FABRICATING MEMORY STRUCTURE, AND PRODUCT THEREOF

BACKGROUND OF THE INVENTION

1. Field of Invention

This invention relates to an integrated circuit (IC) process, and particularly to a method for forming separate narrow lines, a method for fabricating a memory structure based on the former method, and a memory structure fabricated based on the methods.

2. Description of Related Art

The resolution in a photolithography process depends on the wavelength of the exposure light, the numerical aperture (NA) of the optical system and the design of the photomask, and therefore has a certain limit. When the resolution required by target patterns exceeds the lithographic resolution, for example, in a case of forming the gate line array of a high-density memory like a high-density flash memory, a pitch reduction method is needed, which may be based on the spacer forming technique.

For example, separate narrow lines beyond the lithographic resolution may be formed using the so-called self-aligned double patterning (SADP) technique. After a target layer is formed, base line patterns are defined over the same by lithography. Spacers of a smaller width/pitch are formed on the sidewalls of the base line patterns as target line patterns and connection patterns therebetween, and then the base line patterns are removed. Each connection pattern is partially or entirely removed using a specific lithographically defined mask layer to disconnect the target line patterns, and then the disconnected target line patterns are transferred.

Accordingly, the method is tedious as requiring two lithographic processes.

SUMMARY OF THE INVENTION

In view of the foregoing, this invention provides a method for forming separate narrow lines.

This invention also provides a method for fabricating a memory structure, which is an embodiment of the above method of this invention.

This invention also provides a memory structure fabricated using the method.

The method for forming separate narrow lines of this invention is as follows. A target layer is formed over a substrate. Base patterns are formed over the target layer.

Target line patterns and connection patterns between the ends thereof are formed as spacers on the sidewalls of the base patterns. The base patterns are removed. The target line patterns and the connection patterns are transferred to the target layer to form target lines and connection segments between the ends of the target lines. At least a portion of each connection segment is removed to disconnect the target lines while other area of the substrate is subjected to a patterned removal treatment.

In an embodiment of the method, the base patterns include a plurality of base line patterns substantially parallel with each other, and may further include a plurality of base lateral patterns at a part of the ends of the base line patterns. When the target layer includes a conductive layer and the base lateral patterns has a width/pitch greater than that of the base line patterns, each connection segment transferred from the connection patterns previously formed on sidewalls of the base lateral patterns may be removed by only a portion thereof so that the remaining portions thereof can be used to connect with the contact plugs for biasing the corresponding target lines.

The method for fabricating a memory structure of this invention is described as follows. The memory structure includes a cell area and a word line contact area on a substrate. A buried drain insulator is formed at least in the cell area. A conductive layer is formed over the substrate. A plurality of substantially parallel word line patterns, together with a plurality of connection patterns between the ends of the word line patterns in the word line contact area, are formed through a pitch reduction process. The word line patterns and the connection patterns are transferred to the conductive layer to form a plurality of word lines, and a plurality of connection segments between the ends of the word lines in the word line contact area. A portion of the substrate in the cell area not covered by the buried drain insulator is removed to form trenches in the substrate, and at least a portion of each connection segment in the word line contact area is simultaneously removed to disconnect the word lines.

In an embodiment, the buried drain insulator is formed only in the cell area.

In another embodiment, the buried drain insulator is formed also in the word line contact area, at least at a plurality of positions that will be under the to-be-removed portions of the connection segments. In the word line contact area, the buried drain insulator may include a plurality of insulator islands only at the positions, or include a contiguous insulator layer in a contiguous region including the positions.

In addition, both removals in the above method may use a patterned mask layer that has, in the word line contact area, a plurality of separate openings exposing the to-be-removed portions of the connection segments, or a contiguous opening exposing the to-be-removed portions of the connection segments.

The memory structure of this invention includes: a substrate having a cell area and a word line contact area, a plurality of buried drains in the substrate in the cell area, a buried drain insulator on the buried drains and also in the word line contact area, a plurality of word lines crossing over the buried drain insulator in the cell area and extending to the word line contact area, and a plurality of lateral extension lines disposed at ends of the word lines in the word line contact area and arranged in pairs. The buried drain insulator in the word line contact area is at least between each pair of lateral extension lines.

In the method of this invention, because the connection patterns formed together with the narrow target line patterns are not cut using a specific lithographically defined mask layer but the connection segments transferred from the connection patterns are cut while other area of the substrate is subjected to a patterned removal treatment, i.e., the cutting of the connection patterns is integrated with the patterning in other area of the substrate, one lithography process is saved as compared to the conventional SADP process.

In order to make the aforementioned and other objects, features and advantages of this invention comprehensible, a preferred embodiment accompanied with figures is described in detail below.

DESCRIPTION OF EMBODIMENTS

This invention is further explained with the following embodiments, which are not intended to limit the scope of this invention. For example, although a non-volatile memory structure and its fabrication process are taken as examples in the embodiments, the method for forming separate narrow lines of this invention may alternatively be applied to form narrow conductive lines of non-memory elements, or even non-conductive narrow lines, beyond the lithographic resolution.

Moreover, although each base pattern has a line shape in these embodiments, the base pattern may alternatively have any other shape, as long as the spacer formed on its sidewall later is narrow enough to be target line patterns and connection patterns.

<First Embodiment>

FIGS. 1-9 illustrate a method for fabricating a memory structure according to a first embodiment of this invention, wherein some figures include sub-figures (a, b . . . ) illustrating different views of the structure with indication of the types of the views.

Figure 1:
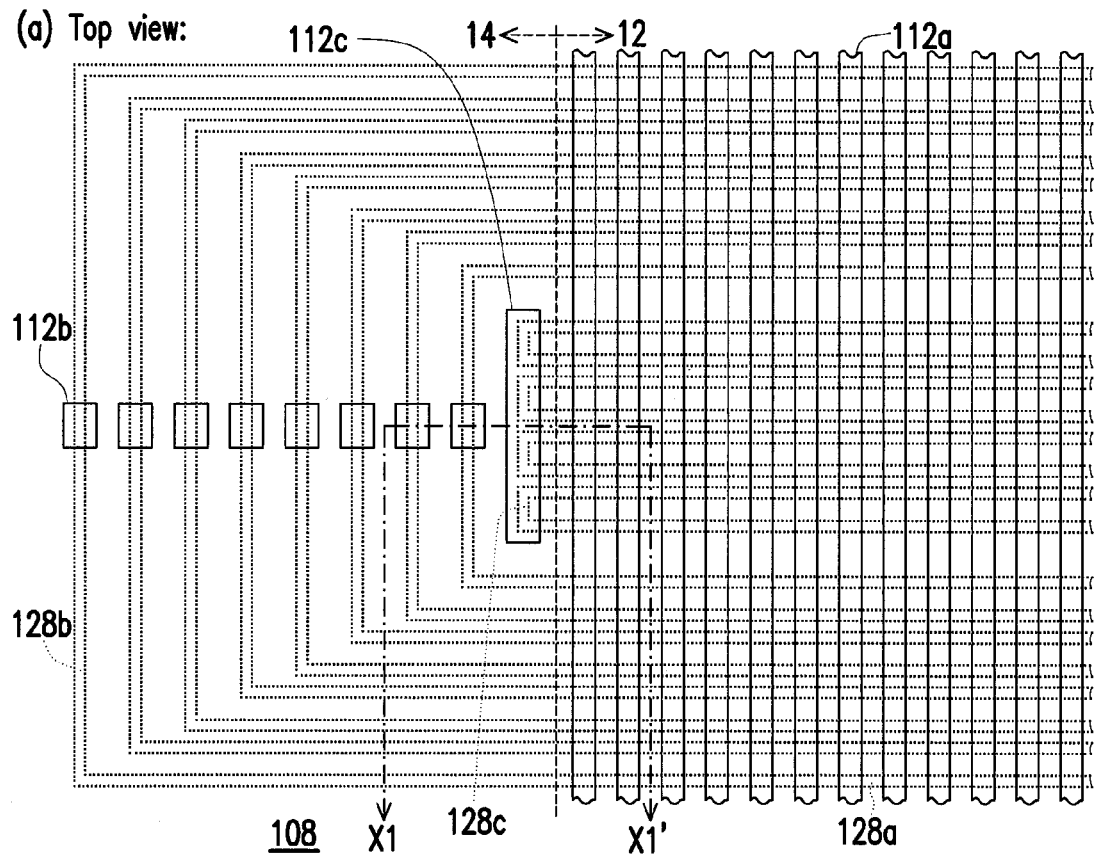
FIGS. 1-9 illustrate a method for fabricating a memory structure according to a first embodiment of this invention, wherein some figures include sub-figures (a, b . . . ) illustrating different views of the structure with indication of the types of the views, and FIGS. 8 and 9 also illustrate a memory structure according to the first embodiment.
Figure 1:
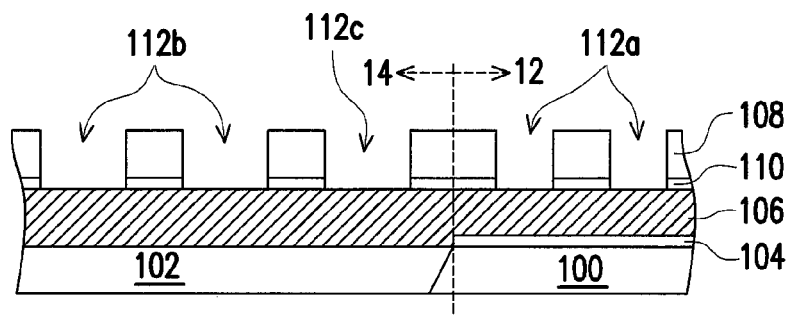

Referring to FIG. 1 that includes a top view (a) and X1-X1' cross-sectional view (b), a substrate 100, such as a lightly doped single-crystal silicon substrate, is provided, including a cell area 12 and a word line contact area 14. An isolation structure 102, such as a shallow trench isolation (STI) structure, has been formed in the substrate 100 in the word line contact area 14. The isolation structure 102 is also formed in other areas such as the periphery area (not shown), as known in related art.

A charge trapping structure 104, which may be an ONO composite including bottom silicon oxide, trapping silicon nitride and top silicon oxide that are stacked in sequence, is formed on the substrate 100 in the cell area 12. A conductive layer 106 such as a doped poly-Si layer is formed, and then a patterned hard mask layer 108 is formed over the conductive layer 106. The hard mask layer 108 may include silicon nitride, and is usually deposited after a pad oxide layer 110 is formed.

The patterned hard mask layer 108 has therein openings 112a, 112b and 112c for defining the buried drains and the buried drain insulator that will be formed later. The openings 112a are in the cell area 12, defining the portion of the buried drain oxide that will be crossed over by the word lines defined later by word line patterns (128a, shown in dotted lines as having not been formed). The openings 112b and 112c are in the word line contact area 14, defining portions of the buried drain oxide that will be under the to-be-removed portions of the connection segments defined later by the connection patterns (128b and 128c, not formed yet) between the ends of the word line patterns 128a. The connection patterns 128b have a larger pitch than the word line patterns 128a, defining the lateral extension lines at the ends of the word lines connected to the contact pads and plugs. The connection patterns 128c define the connection segments at the ends of the work lines not connected to contact pads and plugs, and these connection segments are usually entirely removed.

Figure 2:
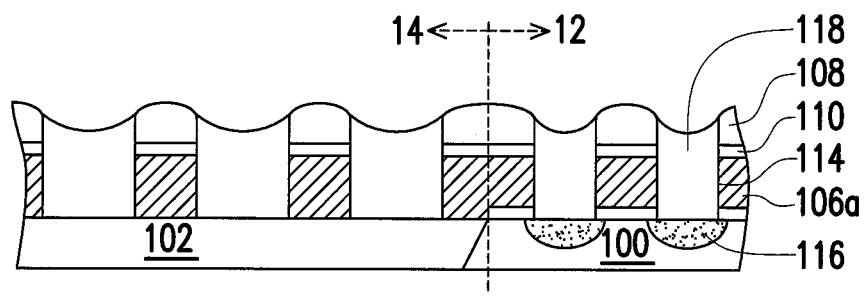

Referring to FIGS. 1-2, the conductive layer 106 is patterned using the patterned hard mask layer 108 as a mask to form a precursor layer 106a of both the gates of the memory cells in the cell area 12 and lower parts of the connection lines and contact pads in the word line contact area 14, with openings 114 therein corresponding to the openings 112a, 112b and 112c in the patterned hard mask layer 108 in the cell area 112 and the word line contact area 14. Buried drains 116 are than formed in the substrate 100 exposed in the openings 114 in the cell area 12, usually through ion implantation. An insulating material, such as silicon dioxide, is then filled in the trenches 114 and the openings in the patterned hard mask layer 108.

Figure 3:
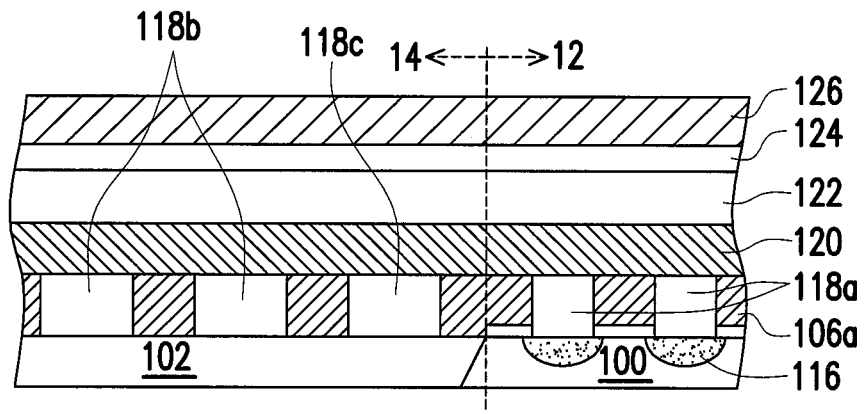

Referring to FIGS. 2-3, the insulating material outside of the openings 114, the patterned hard mask layer 108 and the pad oxide 110 are removed to form a buried drain insulator 118a+b+c. As mentioned above, the buried drain insulator 118a in the cell area 12 will be crossed over by the word lines. The buried drain insulator 118b in the word line contact area 14 is formed in the form of separate islands, and will be under the to-be-removed portions of the connection segments at the ends of the word lines that will be connected to contact plugs. The buried drain insulator 118c in the word line contact area 14 will be under the connection segments at the ends of the word lines that will not be connected to contact plugs.

Then, another conductive layer 120, another hard mask layer 122, an anti-reflection coating (ARC) 124 and a photoresist layer 126 are sequentially formed over the precursor layer 106a and the buried drain insulator 118a+b+c. The conductive layer 120 may include the same material of the conductive layer 106, such as doped poly-Si. The hard mask layer 122 may be a composite hard mask including a silicon oxide layer and a poly-Si layer thereon. The ARC 124 may include a BARC.

Figure 4:
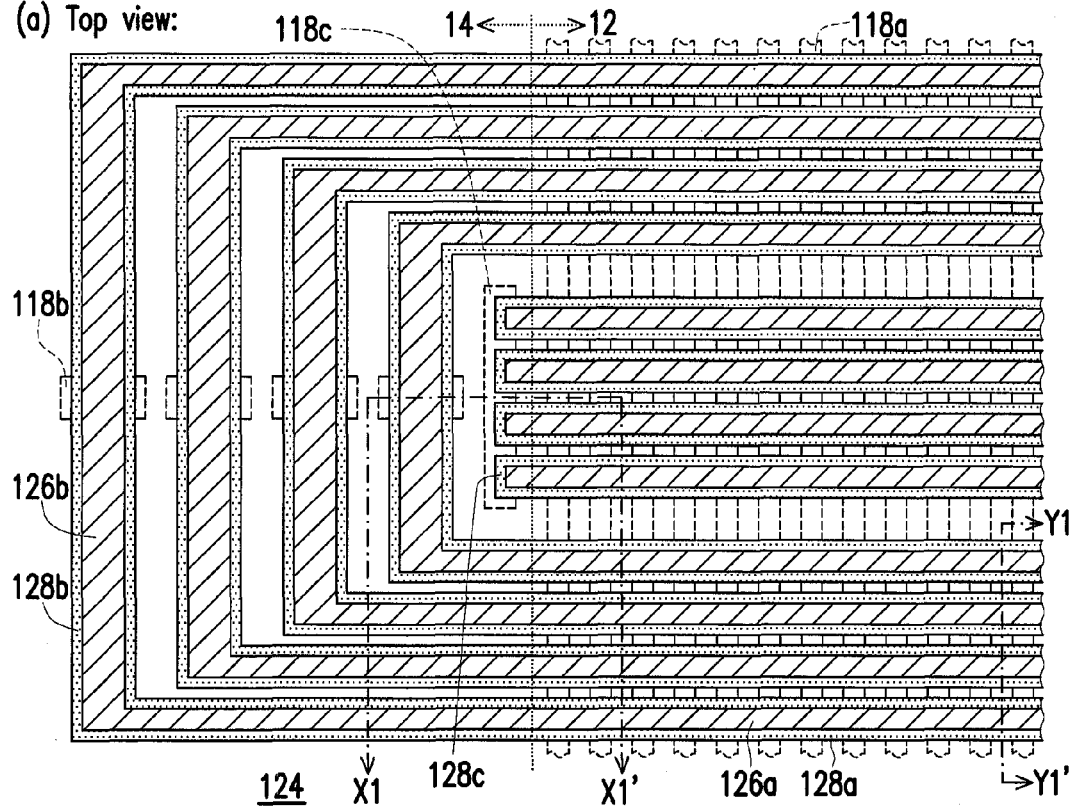
Figure 4:
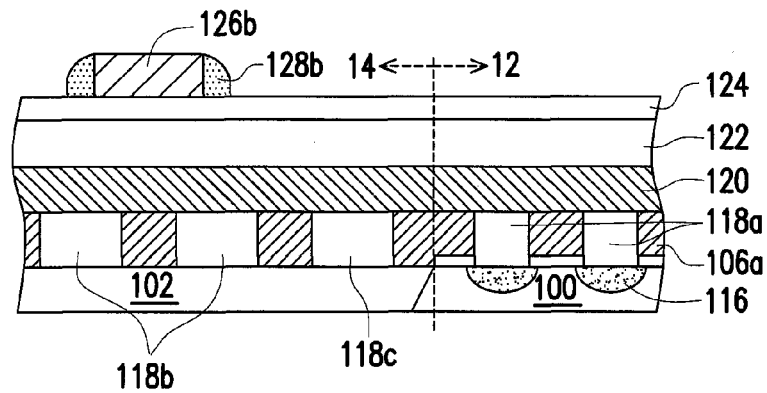
Figure 4:
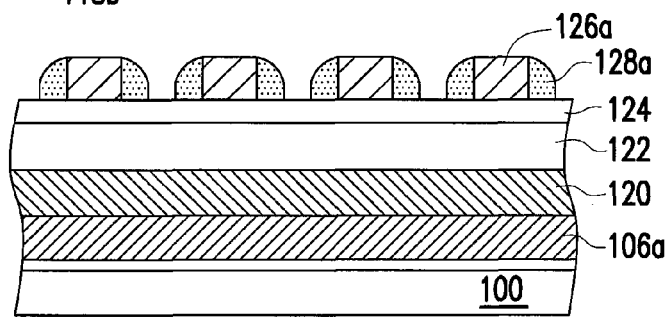

Referring to FIG. 4 that includes a top view (a), X1-X1' cross-sectional view (b) and Y1-Y1' cross-sectional view (c), the photoresist 126 is lithographically patterned into substantially parallel base line patterns 126a for defining the word lines later, and base lateral patterns 126b for defining the connection segments for connecting the word lines to the contact plugs. Then, word line patterns 128a and connection patterns 128b and 128c are formed as spacers on the sidewalls of the base line patterns 126a and the base lateral patterns 126b, possibly by depositing a substantially conformal material layer and then anisotropically etching the same, wherein the material layer may include low-temperature oxide (LTO).

As mentioned above, the connection patterns 128b in the word line contact area 14 have a greater pitch as compared to the word line patterns 128a in the cell area 12, and define the lateral extension lines at the ends of the word lines for connecting with the contact plugs. The connection patterns 128c define the connection segments at the ends of the work lines not connected to contact plugs, which are usually all removed.

Figure 5:
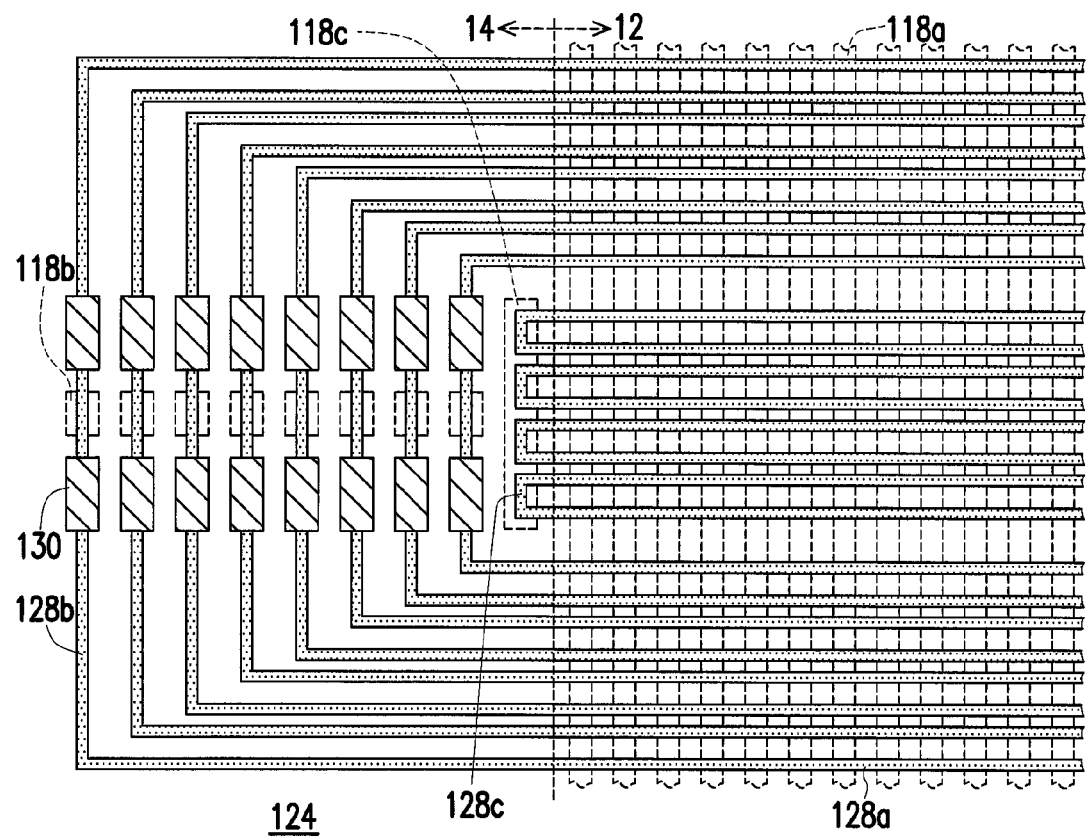

Referring to FIG. 5, a plurality of contact pad patterns 130 is lithographically defined, which usually includes a photoresist material. Each contact pad pattern 130 crosses over a half of a connection pattern 128b that defines a lateral extension line for connecting the corresponding word line to its contact pad and its contact plug.

Figure 6:
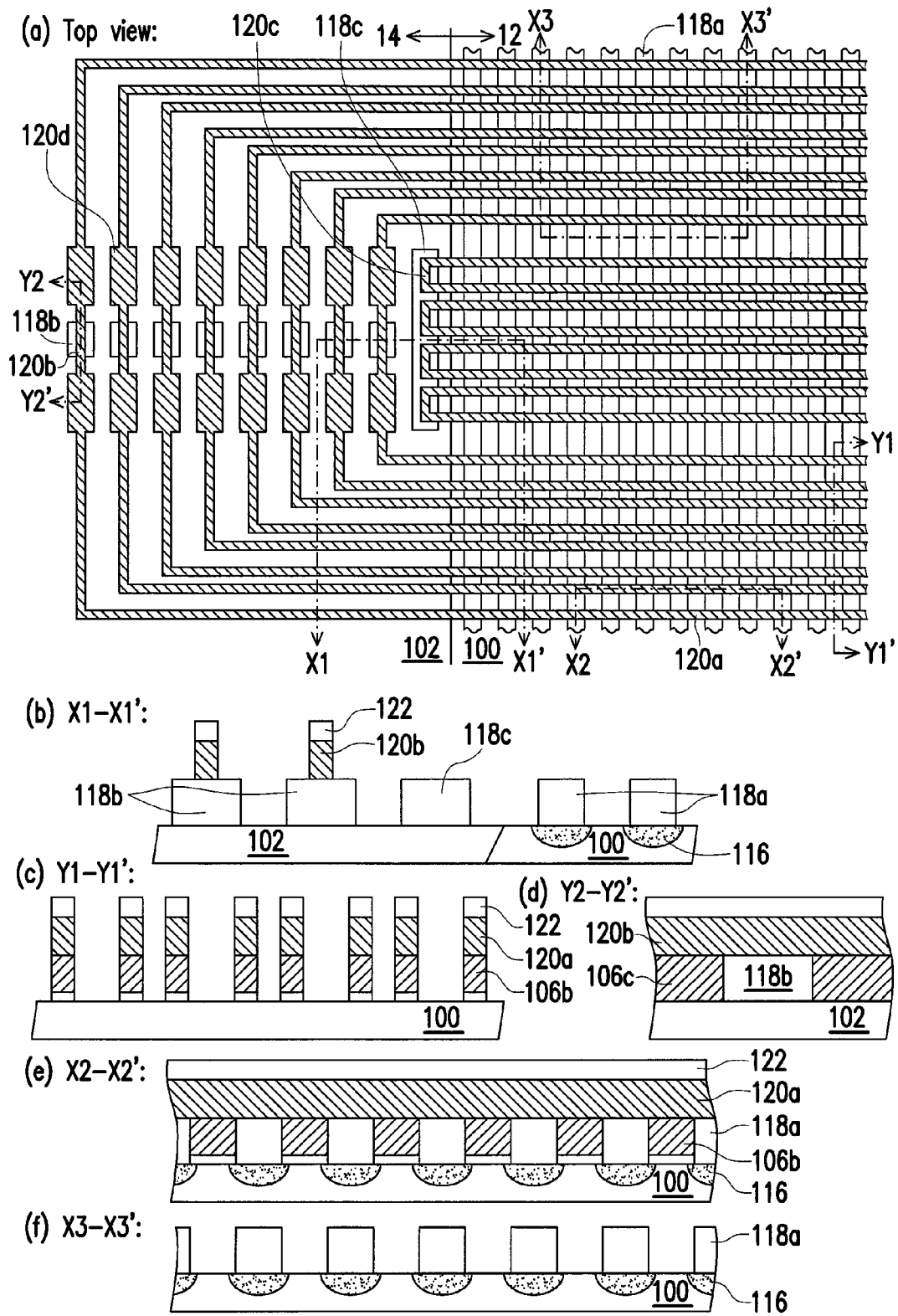

Referring to FIG. 5 and FIG. 6 that shows a top view (a), X1-X1' cross-sectional view (b), Y1-Y1' cross-sectional view (c), Y2-Y2' cross-sectional view (d), X2-X2' cross-sectional view (e) and X3-X3' cross-sectional view (f), the word line patterns 128a, the connection patterns 128b and 128c, and the contact pad patterns 130 are then transferred to the conductive layer 120 and the precursor layer 106a to form word lines 120a and gates 106b of the memory cells (see (c) and (e)), connection segments 106c+120b (see (b) and (d)) and 120c, and contact pads 120d. It is noted that the portion of each connection segment on the buried drain insulator 118b includes only a portion of the layer 120b but no portion of the layer 106c (see (b) and (d)), and is a part of or includes the to-be-removed portion of the connection segment. The X3-X3' cross-sectional view (f) is provided for clear description of the subsequent process.

Figure 7:
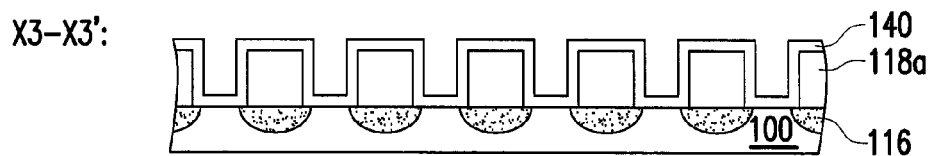

Referring to FIG. 7, an oxide liner 140 is formed all over the substrate 100, for blocking silicide formation in a salicide process for the MOS transistors in the periphery area (not shown).

Figure 8:
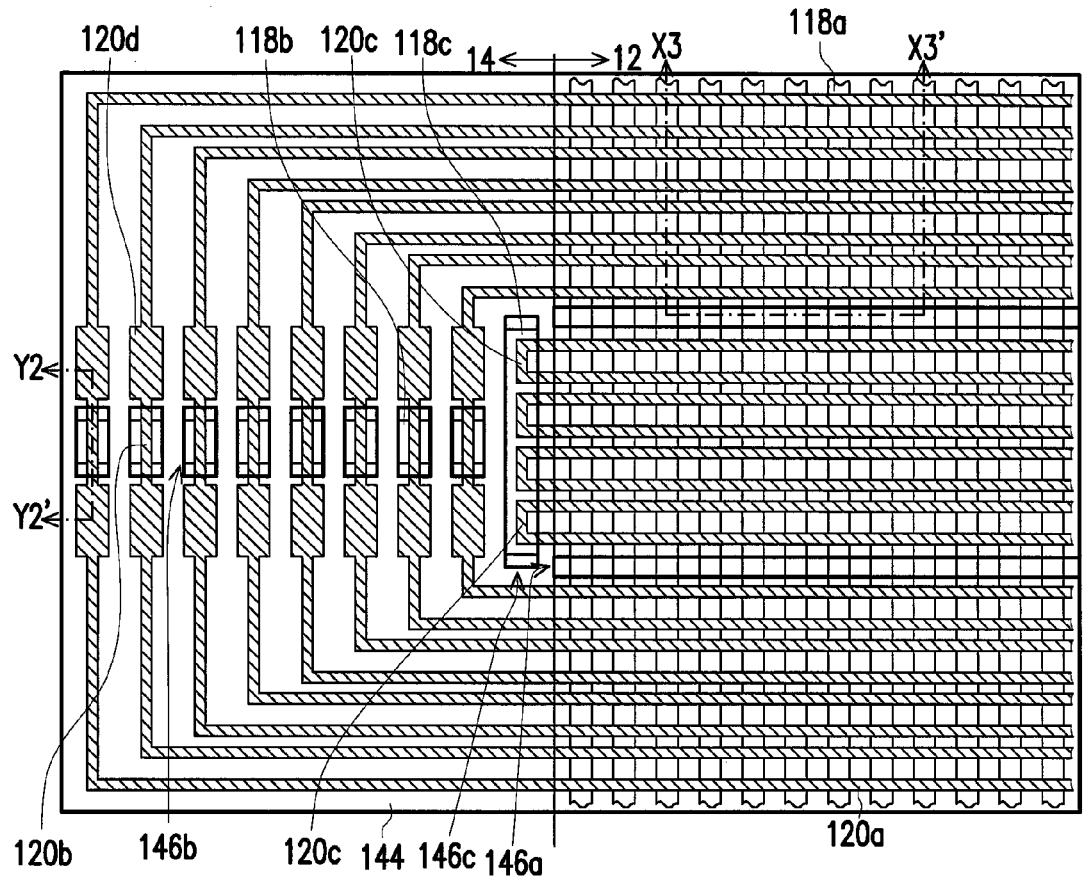
Figure 8:
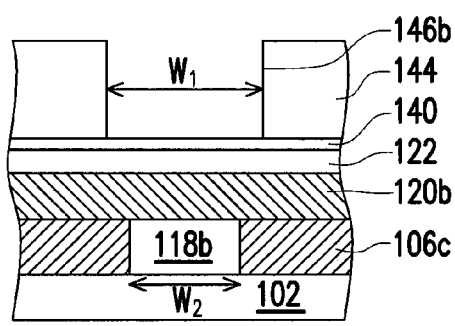

Referring to FIG. 8 that shows a top view (a) and Y2-Y2' cross-sectional view (b), a patterned photoresist layer 144 is formed over the above resulting structure, having therein openings 146a, 146b and 146c. The openings 146a are in the cell area 12, exposing the substrate 100 and the buried drain insulator 118a between the $2^n$-line sets (n=3 in the figure) of the word lines 120a. The openings 146b and 146c are in the word line contact area 14. Each opening 146b exposes a to-be-removed portion of a connection segment 120b (mostly) on the buried drain insulator 118b between the for-contact ends of two word lines 120a. The opening 146c exposes the entirety of each connection segment 120c between the not-for-contact ends of the word lines 120a.

As being viewed from the direction of the word lines 120a, the width $W_1$ of the opening 146b may be larger than the width $W_2$ of the buried drain insulator 118b as shown in the figure. $W_1$ may alternatively be equal to or smaller than $W_2$.

Figure 9:
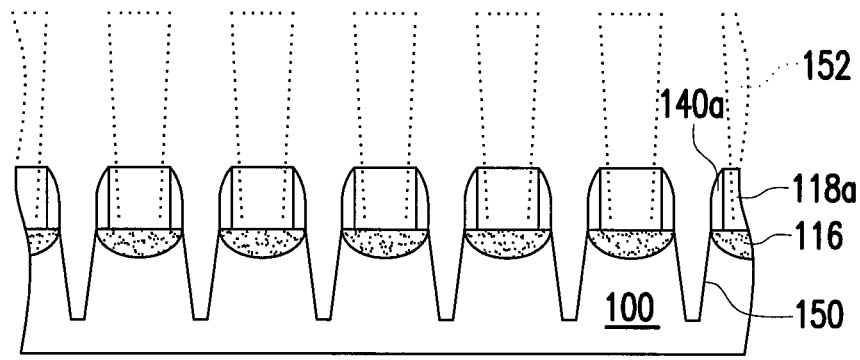
Figure 9:
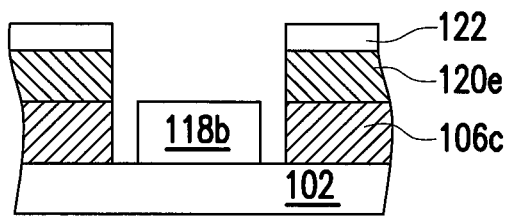

Referring to FIG. 8 and FIG. 9 that shows X3-X3' cross-sectional view (a) and the Y2-Y2' cross-sectional view (b), anisotropic etching is performed with the patterned photoresist layer 144 as a mask, wherein the exposed portion of the oxide liner 140 is made into spacers 140a on the sidewalls of the buried drain insulator 118a, a plurality of trenches 150 are formed in the cell area 12 in the substrate 100 between the buried drains 116 and not covered by the buried drain insulator 118a and the spacers 140a, and each connection segment 120b is removed by a portion thereof to be cut apart and form the upper parts 120e of the two lateral extension lines 160c+120e of the corresponding two word lines 120a. The anisotropic etching may be stopped on the buried drain insulator 118b to just cut apart the connection segment 120b, and may be continued to further remove the exposed portion of the conductive layer 106c, as shown in the figure.

The next step may be filling the trenches 150 with an insulator, such as silicon oxide, to reduce the interference between the bit line contacts 152 formed later on buried drains 116. This step is known in the art and hence not shown in the drawings. Before this step, a dopant with a conductivity type opposite to that of the buried drains 116 may be doped in the substrate 100 around the trenches 150. By doing so, the interference between the bit line contacts 152 can be further reduced. The part of the above process occurring in the cell area 12, which includes forming the trenches 150 in the substrate 100 between the buried drains 116 and filling the trenches 150 with an insulating material, is usually called a self-aligned trench (SAT) process in related art.

FIGS. 8-9 also illustrate a memory structure according to the first embodiment. The memory structure includes: a substrate 100 having a cell area 12 and a word line contact area 14, a plurality of buried drains 116 in the substrate 100 in the cell area 12, a buried drain insulator 118a+b+c on the buried drains 116 in the cell area 12 and also on the isolation layer 102 in the word line contact area 14, a plurality of word lines 120a crossing over the buried drain insulator 118a in the cell area 12 and extending to the word line contact area 14, and a plurality of lateral extension lines 106c+120e disposed at the ends of the word lines 120a in the word line contact area 14 and arranged in pairs.

The portions of the buried drain insulator in the word line contact area 14 includes the portions 118b between each pair of lateral extension lines 106c+120e, and the portion 118c beside the not-for-contact ends of the word lines 120a.

<Second Embodiment>

Figure 10:
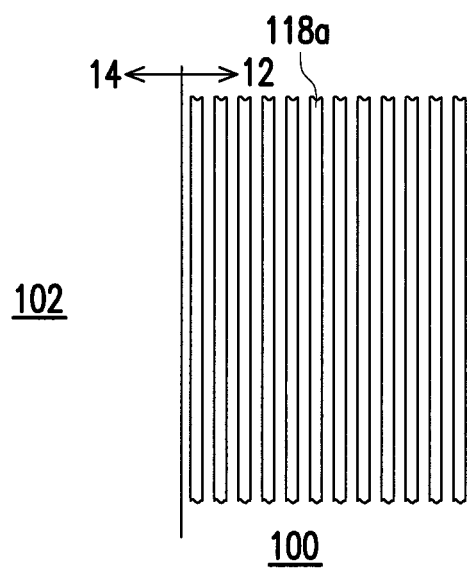
FIGS. 10-12 illustrate certain steps in a method for fabricating a memory structure according to a second embodiment of this invention.
Figures 11, 12:
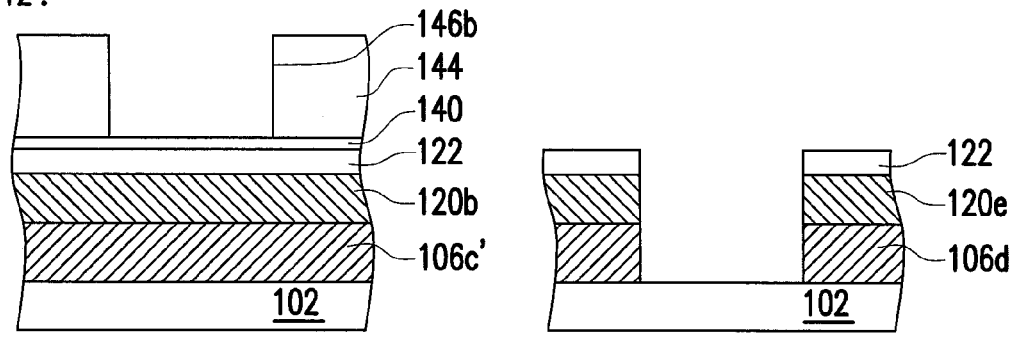

FIGS. 10-12 illustrate some steps in a method for fabricating a memory structure according to a second embodiment of this invention.

The second embodiment is different from the first one mainly in that the buried drain insulator (118a) is formed only on the substrate 100 in the cell area 12 but not in the word line contact area 14, as shown in FIG. 10. As a result, after the word line patterns, the connection patterns and the contact pad patterns are transferred, the to-be-removed portion of each connection segment in the word line contact area 14 includes a portion of the conductive layer 120b defined from the conductive layer 120 and a portion of the conductive layer 106c' defined from the conductive layer 106, as shown in FIG. 11 as Y2-Y2' cross-sectional view (refer to FIGS. 6 and 8 for the location of Y2-Y2').

The resulting structure after the cutting of the connection segments 106c'+120b is shown in FIG. 12, wherein each connection segment 106c'+120b is cut into two lateral extension lines 106d+120e of two word lines 120a. Because the thickness of the stack of the conductive layers 120b and 106c' required to be cut is larger that of the conductive layer 120b cut in the case with the buried drain insulator as etching stop in the first embodiment, the trenches formed in the substrate 100 in the cell area 12 simultaneously with the cutting are deeper than those formed in the case with the buried drain insulator as etching stop in the first embodiment.

<Third Embodiment>

Figure 13:
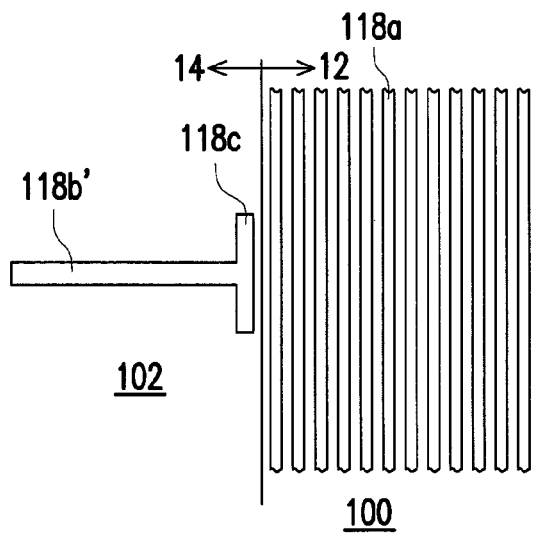
FIG. 13 illustrates the distribution of the buried drain insulator in the fabrication method or structure according to a third embodiment of this invention.

The third embodiment is different from the first embodiment mainly in that the buried drain insulator that will be under the to-be-removed portions of the connection segments at the for-contact ends of the word lines is formed as a contiguous layer 118b' instead of islands, as shown in FIG. 13 in comparison with FIG. 1 that shows the mask patterns 112a, 112b and 112c defining the buried drain insulator to be formed in the first embodiment.

Moreover, the contiguous layer 118b' may be contiguous with the buried drain insulator 118c that will be under the to-be-removed connection segments at the not-for-contact ends of the word lines, as shown in FIG. 13.

<Fourth Embodiment>

Figure 14:
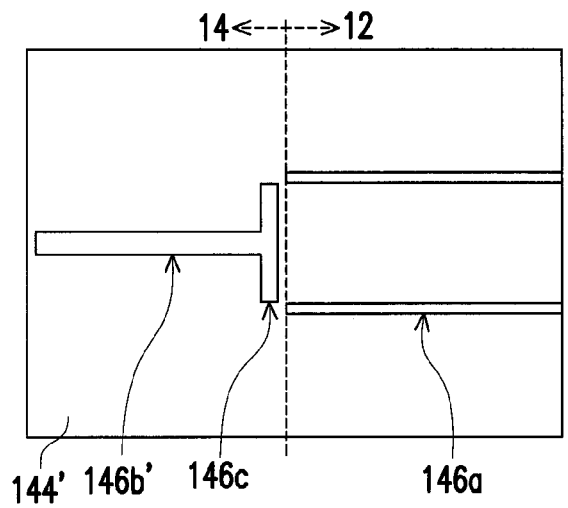
FIG. 14 illustrates the patterned mask layer used in the fabrication method according to a fourth embodiment of this invention.

Referring to FIG. 14, the fourth embodiment is different from the first one in that in the photoresist layer 144 for trench formation in the substrate 100 in the cell area 12 and cutting of the connection segments, a contiguous opening 146b', instead of separate openings (146b in FIG. 8), is formed to expose the to-be-removed portions of the connection segments 106c+120b at the for-contact ends of the word lines 120a.

Moreover, the contiguous opening 146b' may be contiguous with the opening 146c that exposes the to-be-removed connection segments 120c at the not-for-contact ends of the word lines 120a, as shown in FIG. 14.

<Additional Embodiments>

In the above embodiments, the buried drain insulator design as shown in FIG. 1, 10 or 13 is applied in combination with the mask opening pattern design as shown in FIG. 8, or the buried drain insulator design as shown in FIG. 6 is applied in combination with the mask opening pattern design as shown in FIG. 14. Nevertheless, it is also possible to apply the buried drain insulator design as shown in FIG. 10 or 13 in combination with the mask opening pattern design as shown in FIG. 14.

In the above embodiments, since the connection patterns formed together with the word line patterns are not cut using a specific lithographically defined mask layer but the connection segments transferred from the connection patterns are cut while an SAT process is done to the substrate in the cell area, i.e., the cutting of the connection patterns is integrated with the existing SAT process, one lithography process is saved as compared to the conventional SADP process.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for forming separate narrow lines, comprising:
   forming a target layer over a substrate;
   forming a plurality of base patterns over the target layer;
   forming, as spacers on sidewalls of the base patterns, a plurality of target line patterns and a plurality of connection patterns between ends of the target line patterns;
   removing the base patterns;
   transferring the target line patterns and the connection patterns to the target layer to form a plurality of target lines, and a plurality of connection segments between ends of the target lines; and
   removing at least a portion of each connection segment to disconnect the target lines while other area of the substrate is subjected to a patterned removal treatment.

2. The method of claim 1, wherein the target layer comprises a conductive layer and the target lines comprise a plurality of conductive lines.

3. The method of claim 1, wherein the base patterns include a plurality of base line patterns substantially parallel with each other.

4. The method of claim 3, wherein
   the base patterns further include a plurality of base lateral patterns at a part of ends of the base line patterns, and
   the connection patterns are formed on sidewalls of the base lateral patterns and also on sidewalls of ends of the base line patterns without the base lateral patterns.

5. The method of claim 4, wherein
   the target layer comprises a conductive layer,
   the target lines comprise a plurality of conductive lines,
   each of the connection segments transferred from the connection patterns previously formed on the sidewalls of the base lateral patterns is removed by only a portion thereof, and
   each of the connection segments transferred from the connection patterns previously formed on the sidewalls of the ends of the base line patterns without the base lateral patterns is entirely removed.

6. The method of claim 5, further comprising:
   forming a plurality of contact pad patterns over the target layer after the base patterns are removed but before the target line patterns and the connection patterns are transferred to the target layer, wherein each of the contact pad pattern crosses over a connection pattern previously formed on the sidewall of a base lateral pattern; and
   transferring the contact pad patterns to the target layer to form contact pads while the target line patterns and the connection patterns are transferred.

7. The method of claim 5, wherein the conductive lines comprise a plurality of word lines of a memory array.

8. A method for fabricating a memory structure including a cell area and a word line contact area on a substrate, comprising:
   forming a buried drain insulator at least in the cell area;
   forming a conductive layer over the substrate;
   forming, through a pitch reduction process, a plurality of substantially parallel word line patterns, and a plurality of connection patterns between ends of the word line patterns in the word line contact area;
   transferring the word line patterns and the connection patterns to the conductive layer to form a plurality of word lines, and a plurality of connection segments between ends of the word lines in the word line contact area; and
   removing a portion of the substrate in the cell area not covered by the buried drain insulator to form a plurality of trenches in the substrate, and simultaneously removing at least a portion of each connection segment in the word line contact area to disconnect the word lines.

9. The method of claim 8, wherein the buried drain insulator is formed only in the cell area.

10. The method of claim 8, wherein the buried drain insulator is formed also in the word line contact area, at least at a plurality of positions that will be under the to-be-removed portions of the connection segments.

11. The method of claim 10, wherein in the word line contact area, the buried drain insulator is formed as a plurality of islands only at the positions.

12. The method of claim 10, wherein in the word line contact area, the buried drain insulator is formed as a contiguous layer in a contiguous region including the positions.

13. The method of claim 8, wherein both removals use a patterned mask layer that has, in the word line contact area, a plurality of separate openings exposing the to-be- removed portions of the connection segments.

14. The method of claim 8, wherein both removals use a patterned mask layer that has, in the word line contact area, a contiguous opening exposing the to-be-removed portions of the connection segments.

15. The method of claim 8, further comprising:
   forming a plurality of contact pad patterns over the conductive layer after the word line patterns and the connection patterns are formed but before the word line patterns and the connection patterns are transferred, wherein each of the contact pad patterns crosses over a connection pattern; and
   transferring the contact pad patterns to the conductive layer to form a plurality of contact pads while the word line patterns and the connection patterns are transferred.

16. The method of claim 8, wherein the pitch reduction process comprises:
   forming, over the conductive layer, a plurality of substantially parallel base line patterns, and a plurality of base lateral patterns at ends of the base line patterns in the word line contact area, wherein the base lateral patterns has a width/pitch greater than a width/pitch of the base line patterns;
   forming, as spacers on sidewalls of the base line patterns and the base lateral patterns, the plurality of word line patterns and the plurality of connection patterns; and
   removing the base line patterns and the base lateral patterns.

* * * * *